United States Patent
Shigemitsu et al.

(10) Patent No.: US 10,712,311 B2
(45) Date of Patent: Jul. 14, 2020

(54) MICROCHIP, ANALYSIS SYSTEM, AND METHOD OF PRODUCING MICROCHIP

(71) Applicant: ARKRAY, Inc., Kyoto (JP)

(72) Inventors: Takanari Shigemitsu, Kyoto (JP); Naotsugu Onuma, Kyoto (JP)

(73) Assignee: ARKRAY, Inc., Kyoto (JP)

( * ) Notice: Subject to any disclaimer, the term of this patent is extended or adjusted under 35 U.S.C. 154(b) by 255 days.

(21) Appl. No.: 15/788,081

(22) Filed: Oct. 19, 2017

(65) Prior Publication Data

US 2018/0113094 A1    Apr. 26, 2018

(30) Foreign Application Priority Data

Oct. 25, 2016 (JP) .................... 2016-208759
Sep. 29, 2017 (JP) .................... 2017-191688

(51) Int. Cl.
*G01N 27/453* (2006.01)
*G01N 27/447* (2006.01)
*B01L 3/00* (2006.01)
*B81C 1/00* (2006.01)
*B29C 65/00* (2006.01)

(52) U.S. Cl.
CPC .... *G01N 27/44791* (2013.01); *B01L 3/50273* (2013.01); *B01L 3/502707* (2013.01); *B01L 3/502715* (2013.01); *B81C 1/00206* (2013.01); *G01N 27/44704* (2013.01); *B01L 2200/12* (2013.01); *B01L 2300/0627* (2013.01); *B01L 2300/0816* (2013.01); *B01L 2300/0822* (2013.01); *B01L 2300/0838* (2013.01);
(Continued)

(58) Field of Classification Search
CPC ................. G01N 27/44791; G01N 27/44747
See application file for complete search history.

(56) References Cited

U.S. PATENT DOCUMENTS

| 2007/0051629 | A1 | 3/2007 | Dolnik |
| 2010/0006436 | A1 | 1/2010 | Oishi et al. |
| 2010/0181199 | A1* | 7/2010 | Sugiyama ............... C07K 1/26 204/601 |

FOREIGN PATENT DOCUMENTS

| CN | 102072944 B | 5/2013 |
| EP | 1022562 A1 | 7/2000 |

(Continued)

OTHER PUBLICATIONS

Pédehontan-Hiaa et al., "Layer-by-Layer Assemblies Based on a Cationic-ß-Cyclodextrin Polymer: Chiral Stationary Phases for Open-Tubular Electrochromatography," Chromatographia (2015) 78:533-541 (Year: 2015).*

(Continued)

*Primary Examiner* — Alexander S Noguerola
(74) *Attorney, Agent, or Firm* — Morgan, Lewis & Bockius LLP

(57) ABSTRACT

One embodiment of the invention provides: a microchip including a sample collection section and an analysis section, in which the sample collection section and the analysis section are imparted with both hydrophilicity and a positively-charged layer; an analysis system including the microchip; and a method of producing the microchip. The microchip includes: a sample collection section for collecting a sample; and an analysis section for analyzing the sample. In the microchip, a cationic polymer bonded with a hydrophilization substance is immobilized on inner walls of the sample collection section and the analysis section.

16 Claims, 8 Drawing Sheets

(52) U.S. Cl.
CPC ............... *B01L 2300/0848* (2013.01); *B01L 2300/0887* (2013.01); *B01L 2300/161* (2013.01); *B01L 2400/0406* (2013.01); *B01L 2400/0421* (2013.01); *B01L 2400/088* (2013.01); *B29C 66/026* (2013.01)

(56) References Cited

FOREIGN PATENT DOCUMENTS

| | | |
|---|---|---|
| EP | 2910306 A1 | 8/2015 |
| JP | 2005-126460 A | 5/2005 |
| JP | 2015-166127 A | 9/2015 |

OTHER PUBLICATIONS

P/ACE™ MDQ plus Capillary Electrophoresis System—Methods Development Guide, SCIEX, B54956AA Jan. 2015, 150 pages (Year: 2015).*

Office Communication issued in corresponding European Patent Application No. 17197264.9 dated Nov. 23, 2018.

Extended European Search Report issued in corresponding European Patent Application No. 17197264.9 dated Feb. 7, 2018.

Catai et al., "Efficient and highly reproducible capillary electrophoresis-mass spectrometry of peptides using Polybrene-poly(vinyl sulfonate)-coated capillaries," Electrophoresis, 27: 2091-2099 (2006).

Office Communication issued in corresponding European Patent Application No. 17197264.9 dated Apr. 15, 2019.

* cited by examiner (a)

(b)

(c)

Example 1

Example 2

Example 3

Example 4

Example 5

Example 6

Example 7

Comparative Example 1

Comparative Example 2

Comparative Example 3

MICROCHIP, ANALYSIS SYSTEM, AND METHOD OF PRODUCING MICROCHIP

CROSS-REFERENCE TO RELATED APPLICATION

This application claims priority under 35 USC 119 from Japanese Patent Application No. 2016-208759 and Japanese Patent Application No. 2017-191688, the disclosure of which is incorporated by reference herein.

All publications, patent applications, and technical standards mentioned in this specification are herein incorporated by reference to the same extent as if each individual publication, patent application, or technical standard was specifically and individually indicated to be incorporated by reference.

BACKGROUND

Technical Field

The present invention relates to a microchip, an analysis system, and a method of producing a microchip.

Related Art

Conventionally, samples are analyzed by capillary electrophoresis and, in recent years, for the purposes of downsizing and simplification of apparatuses, electrophoresis using a microchip made into a chip device has been performed. As the microchip, from the standpoint of improving the separation rate and separation accuracy of samples, it is preferred to introduce a positively-charged layer by immobilizing a cationic polymer on inner wall of an analysis section such as a capillary tube.

For instance, a method of producing a chip having a micro flow channel, which method includes immobilizing a quaternary onium group-containing cationic polymer on at least one side of each of a pair of resin substrates and joining the resin substrates using the cationic polymer-immobilized surfaces as joining surfaces, has been proposed (see, for example, Patent Document 1).

Examples of an analysis device used for sample analysis include those which separately contain a first unit having a sample collection section and a second unit having an analysis section such as a capillary tube, and the users collect a specimen (sample) using the first unit and then set the first unit on the second unit to perform sample analysis.

Generally speaking, since the sample collection section sucks in a sample by a capillary force, the inner wall of the sample collection section is desired to be highly hydrophilic. Accordingly, it is preferred to perform a hydrophilization treatment on inner wall of the sample collection section and, for example, a method of hydrophilizing the surface of a resin molded article by forming a hydrophilic film on the surface of the resin molded article through curing of a composition that contains a hydrolyzable organosilicon compound and an inorganic compound fine particles (see, for example, Patent Document 2).

RELATED ART DOCUMENTS

Patent Documents

[Patent Document 1] Japanese Patent Application Laid-Open (JP-A) No. 2015-166127
[Patent Document 2] JP-A No. 2005-126460

SUMMARY OF THE INVENTION

Problems to be Solved by the Invention

In analysis devices (microchips) which separately contain the first unit having a sample collection section and the second unit having an analysis section such as a capillary tube, since the sample collection section and the analysis section are provided in different units, it is necessary to produce the two units separately, and this leads to an increase in production cost. Thus, from the standpoint of reducing the production cost, it is preferred that the sample collection section and the analysis section are provided in the same unit.

As described above, since the sample collection section sucks in a sample by a capillary force, the sample collection section is preferably highly hydrophilic. Particularly, when the analysis section is a micro flow channel such as a capillary tube, in order to attain favorable analysis performance (e.g., separation rate and separation accuracy), it is preferred that the analysis section has a positively-charged layer. From the standpoint of reducing the production cost of a chip device, a microchip production method in which a hydrophilicity-imparted sample collection section and a positively charged layer-imparted analysis section can be formed in the same step is desired.

However, in the method described in Patent Document 1, although a positively-charged layer can be stably imparted to a micro flow channel and the like, it is not possible to impart high hydrophilicity. Moreover, in the method described in Patent Document 2, although high hydrophilicity can be imparted to a micro flow channel and the like, it is not possible to stably impart a positively-charged layer.

An object of one embodiment of the invention is to provide: a microchip including a sample collection section and an analysis section, wherein hydrophilicity and a positively-charged layer are both imparted to the sample collection section and the analysis section; an analysis system including the microchip; and a method of producing the microchip.

Means for Solving the Problems

Concrete means for achieving the above-described object are as follows.

<1> A method of producing a microchip, the method comprising: an immobilization step of immobilizing, on a pair of substrates, a cationic polymer bonded with a hydrophilization substance in a region where a sample collection section for collecting a sample is formed and a region where an analysis section for analyzing the sample is formed; and after the immobilization step, a joining step of joining the pair of substrates, wherein, by the joining step, the sample collection section and the analysis section, in which the cationic polymer bonded with the hydrophilization substance is immobilized, are formed.

<2> The method of producing a microchip according to <1>, wherein the immobilization step comprises: a modification step of immobilizing the cationic polymer in the region where the sample collection section is formed and the region where the analysis section is formed; and a hydrophilization step of bonding the hydrophilization substance to the immobilized cationic polymer.

<3> The method of producing a microchip according to <1>, wherein, in the immobilization step, after the hydrophilization substance is bonded to the cationic polymer, the cationic polymer bonded with the hydrophilization substance is immobilized in the region where the sample collection section is formed and the region where the analysis section is formed.

<4> The method of producing a microchip according to any one of <1> to <3>, wherein the hydrophilization substance has one or more anionic functional groups.

<5> The method of producing a microchip according to <4>, wherein the anionic functional groups include at least a carboxy group or a sulfo group.

<6> The method of producing microchip according to any one of <1> to <5>, wherein the hydrophilization substance has one or more hydrophilic functional groups.

<7> The method of producing microchip according to <6>, wherein the hydrophilic functional groups include at least a hydroxyl group or an amino group.

<8> The method of producing microchip according to any one of <1> to <7>, wherein the cationic polymer comprises at least a polyquaternium or a dimethylamine-epichlorohydrin copolymer.

<9> A microchip comprising: a sample collection section for collecting a sample; and an analysis section for analyzing the sample, wherein a cationic polymer bonded with a hydrophilization substance is immobilized on inner walls of the sample collection section and the analysis section.

<10> The microchip according to <9>, wherein a single unit of the microchip comprises both the sample collection section and the analysis section.

<11> The microchip according to <9> or <10>, wherein the sample collection section and the analysis section are formed by joining a pair of substrates.

<12> The microchip according to any one of <9> to <11>, wherein the hydrophilization substance has one or more anionic functional groups.

<13> The microchip according to <12>, wherein the anionic functional groups include at least a carboxy group or a sulfo group.

<14> The microchip according to any one of <9> to <13>, wherein the hydrophilization substance has one or more hydrophilic functional groups.

<15> The microchip according to <14>, wherein the hydrophilic functional groups include at least a hydroxyl group or an amino group.

<16> The microchip according to any one of <9> to <15>, wherein the cationic polymer comprises at least a polyquaternium or a dimethylamine-epichlorohydrin copolymer.

<17> The microchip according to any one of <9> to <16>, wherein the sample collection section collects the sample using a capillary force.

<18> The microchip according to any one of claims <9> to <17>, wherein the analysis section is a capillary tube.

<19> The microchip according to any one of <9> to <18>, which is used for analyzing a biological substance in the sample by electrophoresis.

<20> The microchip according to <19>, wherein the biological substance is hemoglobin.

<21> An analysis system comprising: the microchip according to any one of <9> to <20>; and an analyzer on which the microchip is mounted.

Effects of the Invention

According to one embodiment of the invention, a microchip including a sample collection section and an analysis section, wherein hydrophilicity and a positively-charged layer are both imparted to the sample collection section and the analysis section; an analysis system including the microchip; and a method of producing the microchip can be provided.

DETAILED DESCRIPTION OF THE INVENTION

Mode for Carrying Out the Invention

Figure 1:
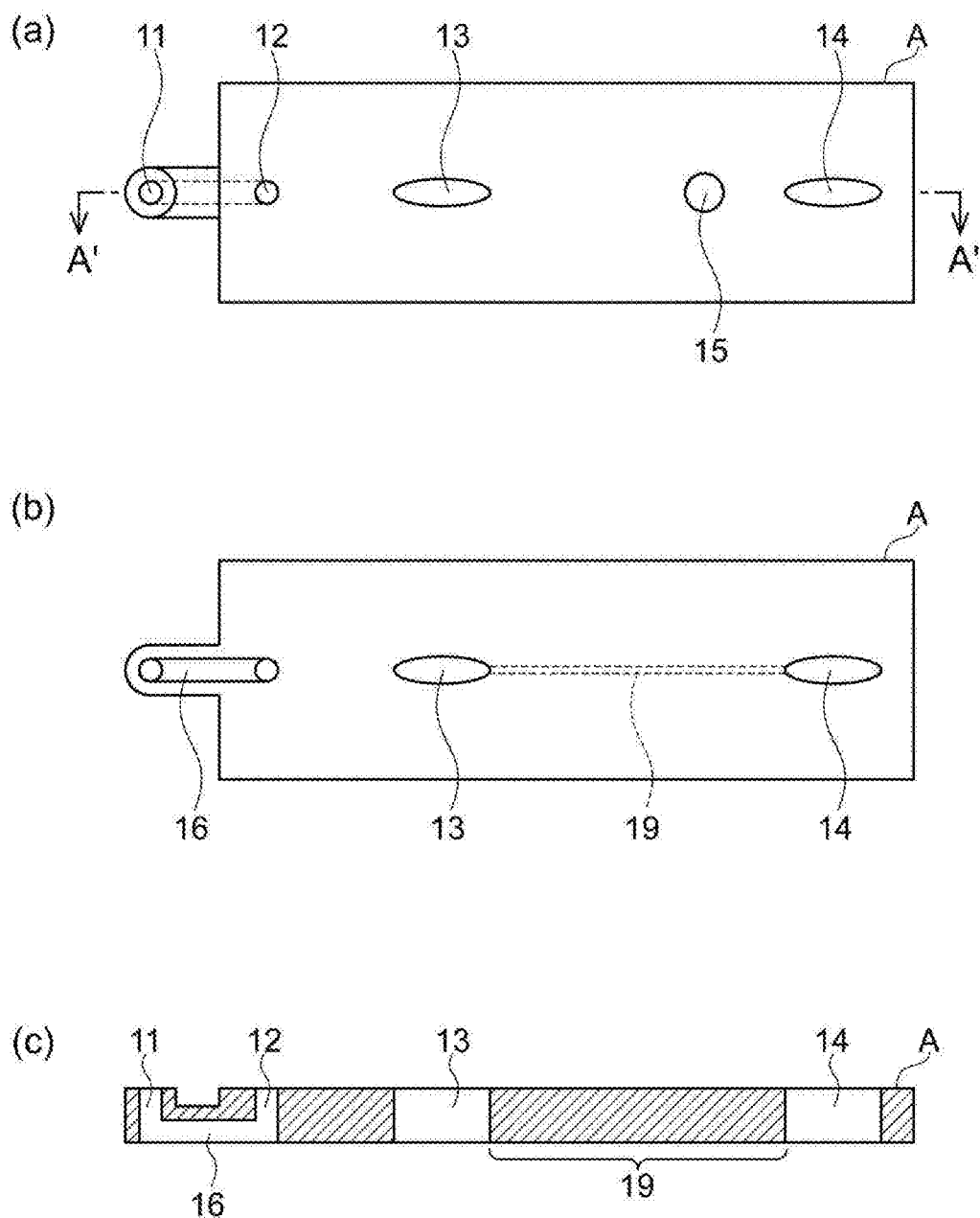
FIG. 1 is a set of schematic structural view showing a substrate (chip part A) used in the method of producing a microchip according to one embodiment of the invention, wherein (a) is a top view, (b) is a bottom view (taken from the joining surface) and (c) is a cross-sectional view of (a) taken along the line A'-A'.

A method of producing a microchip according to one embodiment of the invention and a microchip will now be described.

In the present specification, those numerical ranges that are stated with "to" each denote a range that includes the numerical values stated before and after "to" as the lower and upper limit values, respectively.

[Method of Producing Microchip]

The method of producing a microchip according to one embodiment of the invention includes: an immobilization step of immobilizing, on a pair of substrates, a cationic polymer bonded with a hydrophilization substance in a region where a sample collection section for collecting a sample is formed and a region where an analysis section for analyzing the sample is formed; and, after the immobilization step, a joining step of joining the pair of substrates, wherein, by the joining step, the sample collection section and the analysis section, in which the cationic polymer bonded with the hydrophilization substance is immobilized, are formed.

In the immobilization step, on the pair of substrate, both hydrophilicity and a positively-charged layer can be imparted to the region where the sample collection section is formed and the region where the analysis section is formed and, in the joining step following the immobilization step, the sample collection section and the analysis section, in which the cationic polymer bonded with the hydrophilization substance is immobilized, can be formed by joining the pair of substrates. Further, since a series of these steps can impart each of the region serving as the sample collection section and the region serving as the analysis section with the required properties in the immobilization step, the steps are simplified and the microchip production cost can thus be reduced.

A microchip obtained by the method of producing a microchip according to the present embodiment and the below-described microchip of the present embodiment are used in a variety of analysis methods for diverse samples, preferably for analyzing a substance (preferably a biological substance) contained in a sample by electrophoresis (preferably capillary electrophoresis). Examples of the sample include a biological specimen, such as blood, urea and sweat, and samples that are subjected to environmental surveys, such as water quality survey and geological survey. The sample is preferably blood collected from a human body or the like. The analysis subject is preferably a biological substance contained in the sample, more preferably a biological substance contained in blood. Further, among such biological substances, hemoglobin is preferred.

Among the components contained in blood, examples of a component to be analyzed include hemoglobin (Hb), albumin (Alb), globulin ($\alpha$1, $\beta$2, $\beta$, $\gamma$-globulin), and fibrinogen. Examples of the hemoglobin include normal hemoglobin (HbA0), glycosylated hemoglobin, modified hemoglobin, fetal hemoglobin (HbF), and mutant hemoglobin. Examples of the glycosylated hemoglobin include hemoglobin A1a (HbA1a), hemoglobin A1b (HbA1b), hemoglobin A1c (HbA1c), and GHbLys. Examples of the hemoglobin A1c include stable HbA1c (S-HbA1c) and labile HbA1c (L-HbA1c). Examples of the modified hemoglobin include carbamoylated Hb and acetylated Hb.

<Immobilization Step>

In the immobilization step, on a pair of substrates, a cationic polymer bonded with a hydrophilization substance is immobilized in the region where the sample collection section is formed and the region where the analysis section is formed. By this step, the cationic polymer bonded with the hydrophilization substance is immobilized in the region where the sample collection section is formed and the region where the analysis section is formed and, by the subsequent joining step, a microchip in which both hydrophilicity and a positively-charged layer are imparted to the sample collection section and the analysis section is formed.

(Substrates)

As the substrates, for example, a pair of substrates, which are joined together to form the sample collection section for collecting a sample and the analysis section for analyzing the sample, are used. Examples of the pair of substrates include a chip part A and a chip part B, which are substantially elongated rectangular plate-form members as shown in FIGS. 1 and 2.

Figure 2:
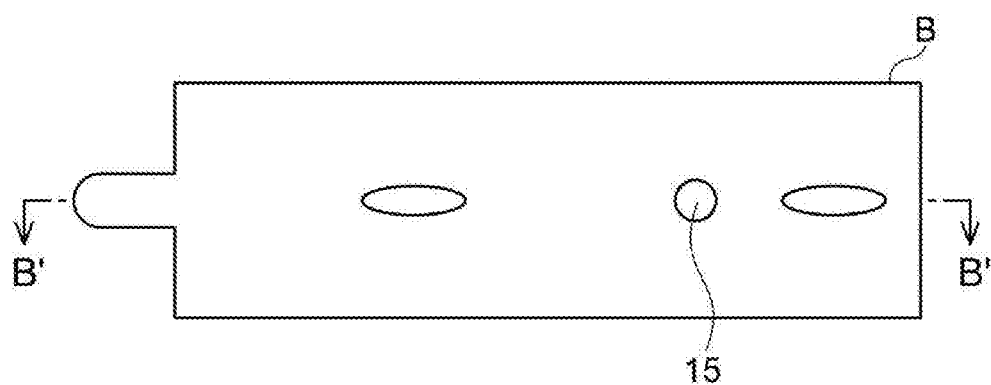
FIG. 2 is a set of schematic structural view showing a substrate (chip part B) used in the method of producing a microchip according to one embodiment of the invention, wherein (a) is a top view, (b) is a bottom view (taken from the joining surface) and (c) is a cross-sectional view of (a) taken along the line B'-B'.
Figure 2:
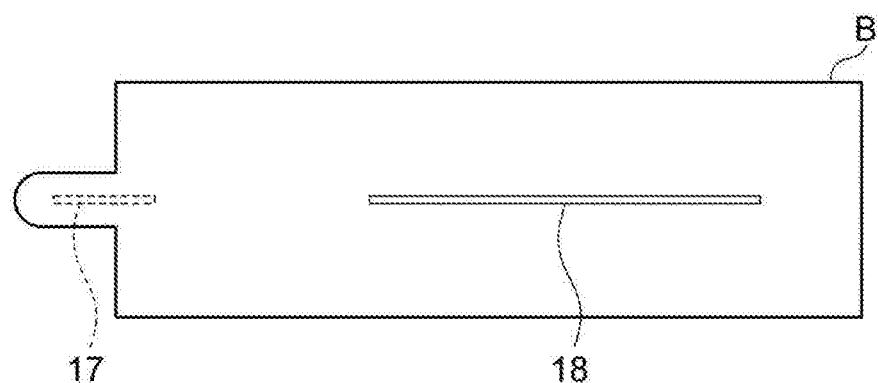
Figure 2:
Figure 3:
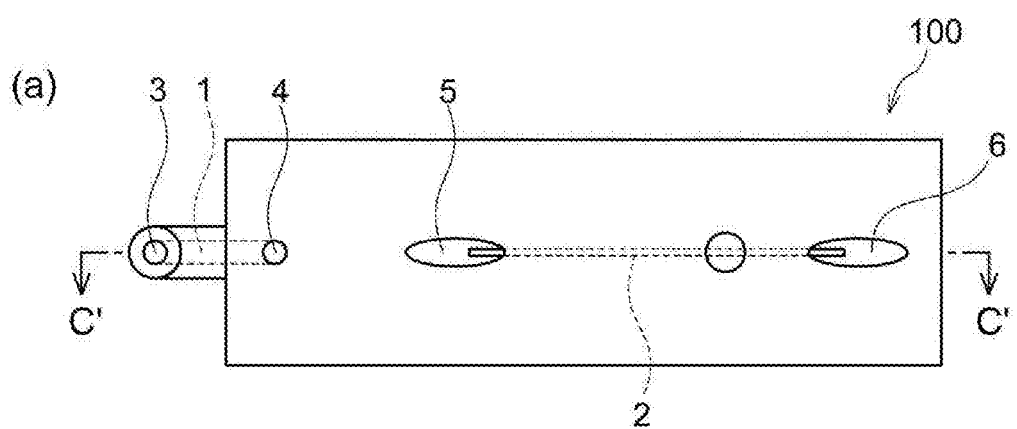
FIG. 3 is a set of schematic structural view showing a microchip produced by the method of producing a microchip according to one embodiment of the invention, wherein (a) is a top view and (b) is a cross-sectional view of (a) taken along the line C'-C'.
Figure 3:
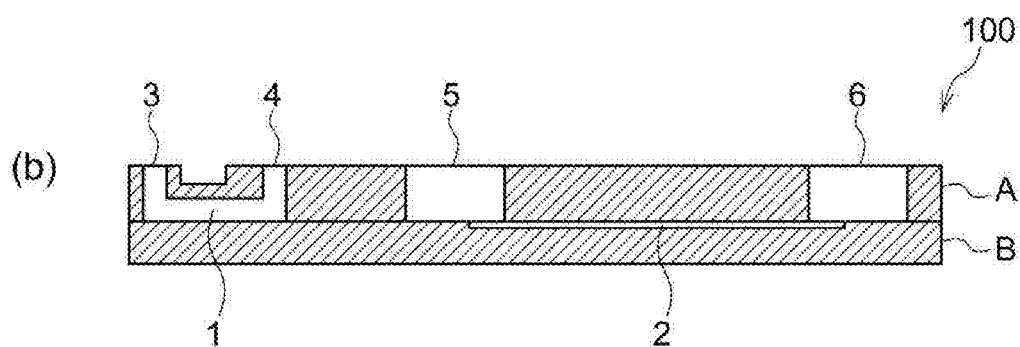
Figure 4A:
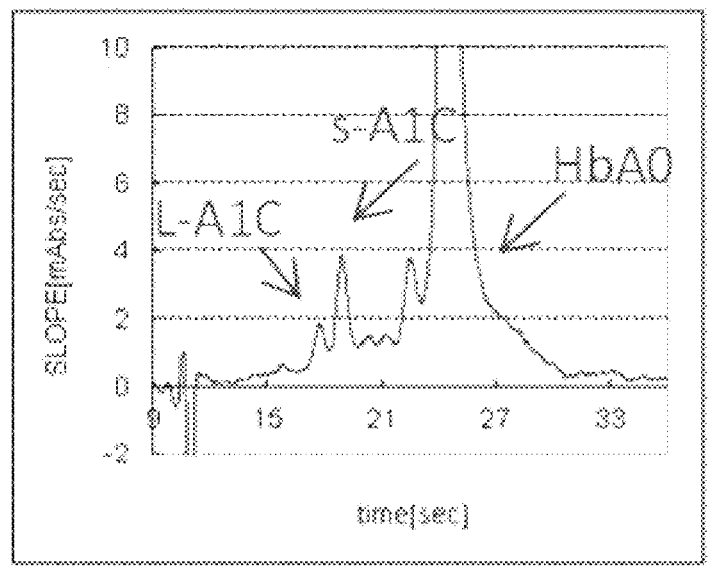
FIGS. 4 (a) to (j) are is a set of graphs showing the results of analyzing hemoglobin in human whole blood using the respective microchips produced in Examples and Comparative Examples.
Figure 4B:
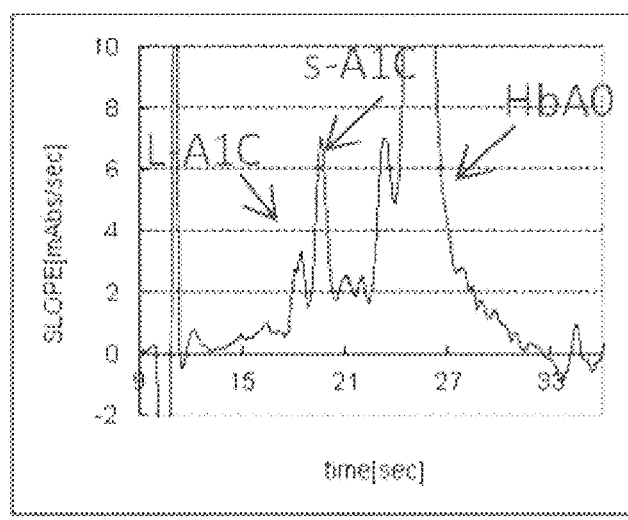
Figure 4C:
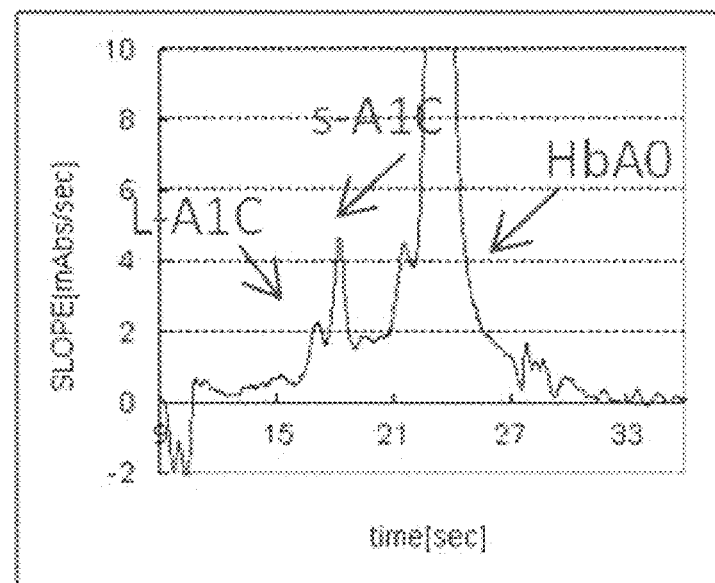
Figure 4D:
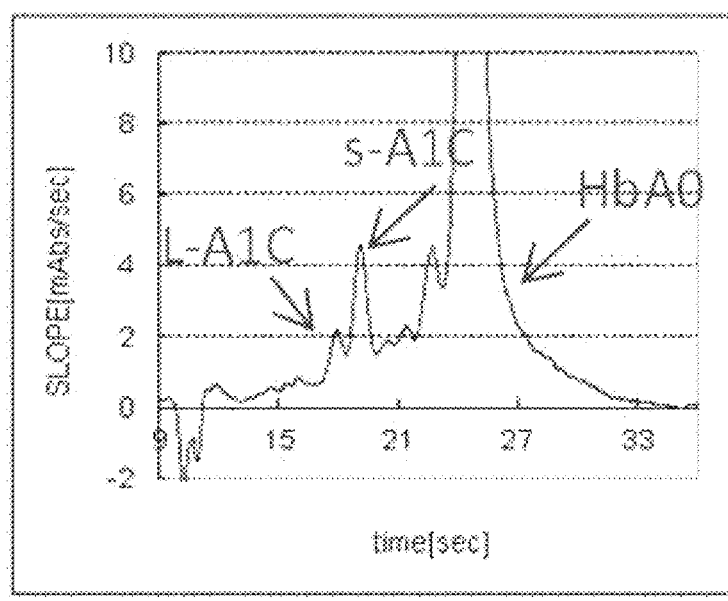
Figure 4E:
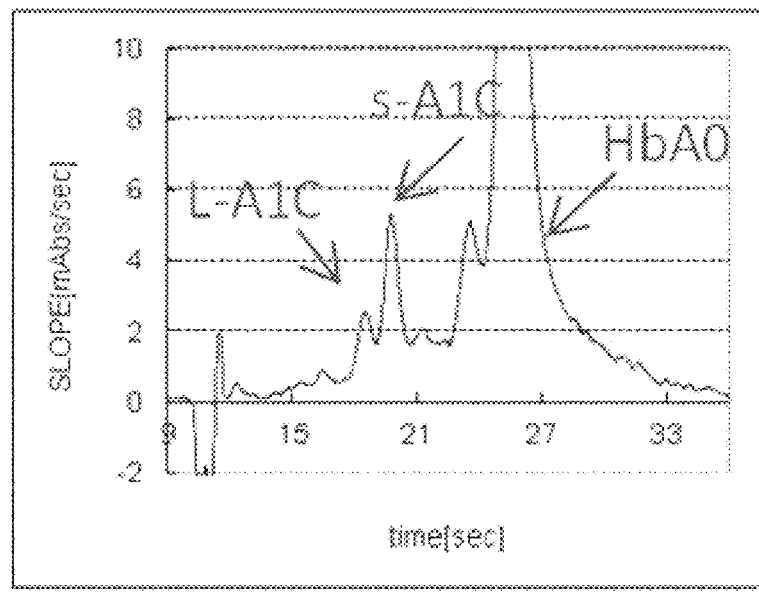
Figure 4F:
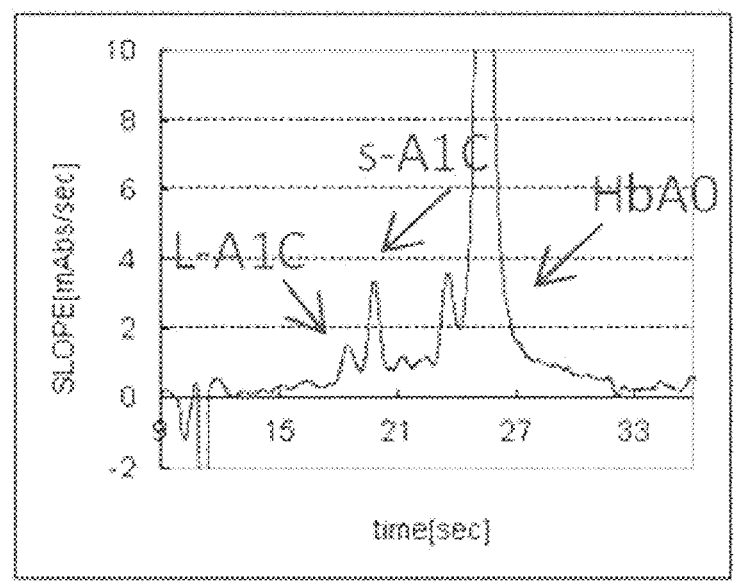
Figure 4G:
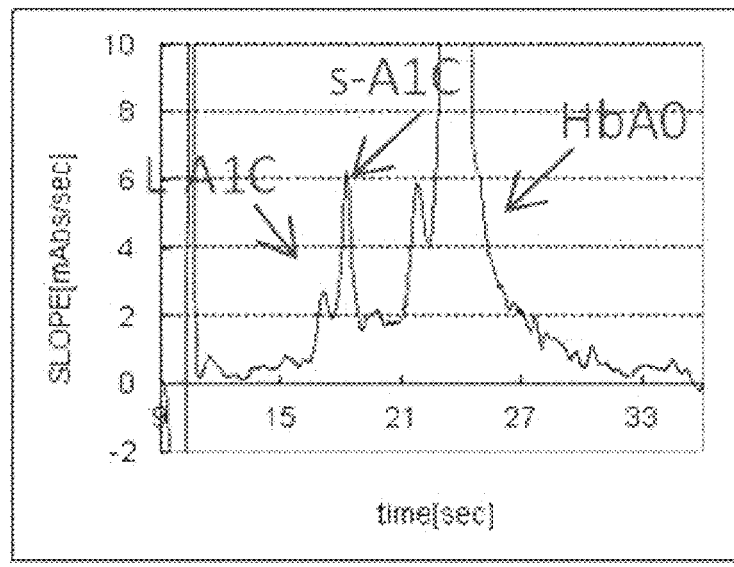
Figure 4H:
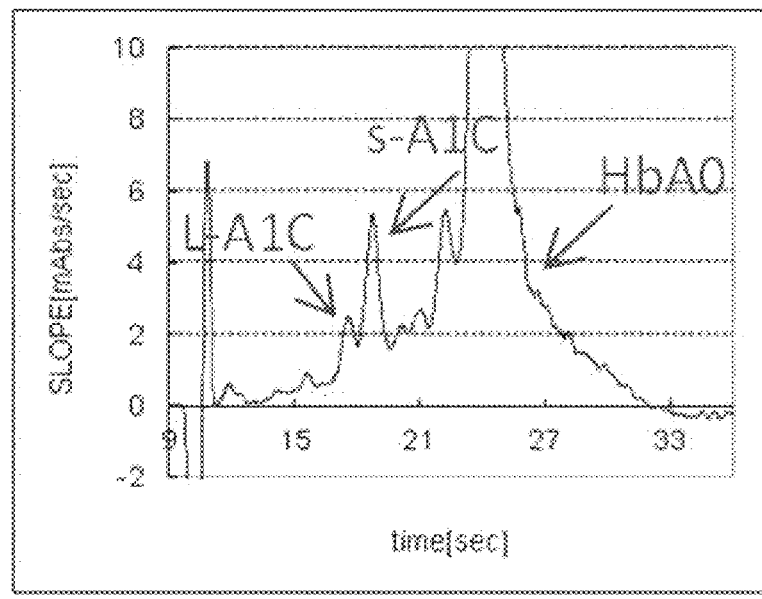
Figure 4I:
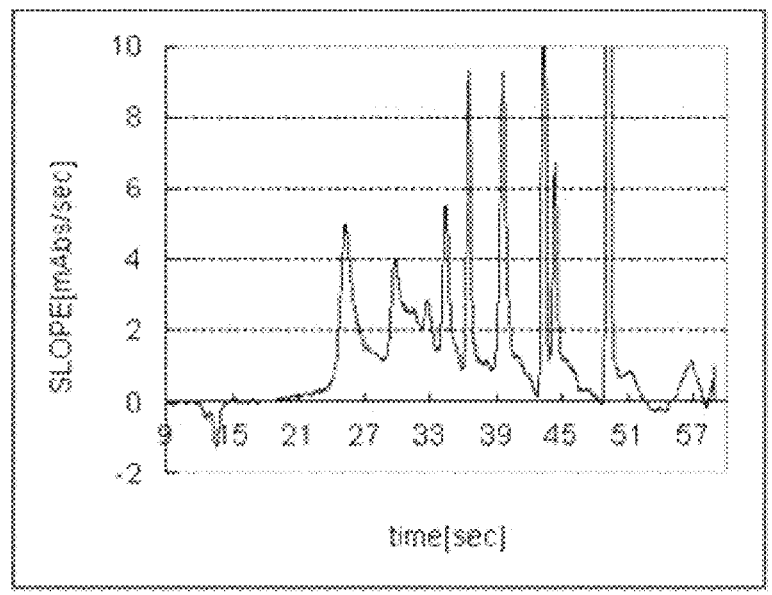
Figure 4J:
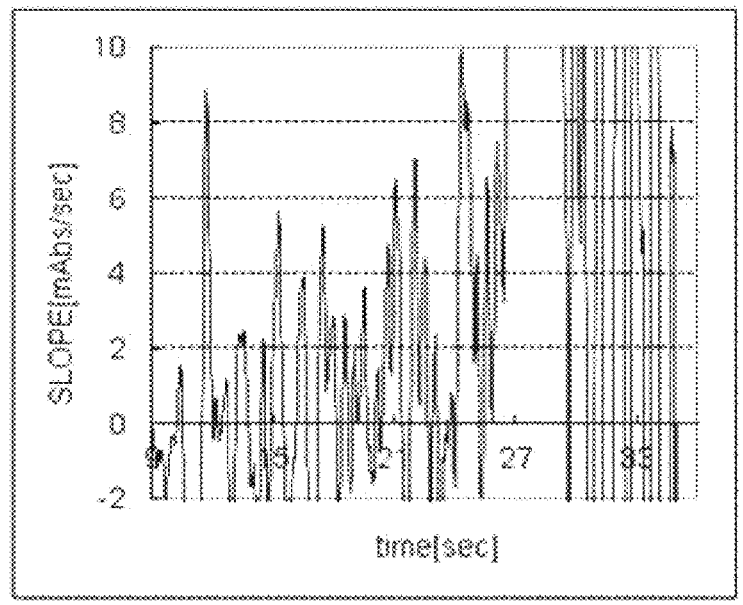

As shown in FIG. 1, a chip part A includes: through-holes 11 to 14; a detection window 15; and a first groove 16 (region where a sample collection section 1 is formed). As shown in FIG. 2, a chip part B includes: the detection window 15; and a second groove 18 (region where an analysis section 2 is formed). Further, the chip part A has a region 19 where the analysis section 2 is formed between the through-holes 13 and 14 on the surface shown in FIG. 1(b), and the chip part B has a region 17 where the sample collection section 1 is formed on the surface shown in FIG. 2(b). In the joining step, the chip part A and the chip part B are joined in such a manner that the surfaces shown in FIG. 1(b) and FIG. 2(b) are joined and the first groove 16 and the second groove 18 face the region 17 and the region 19, respectively, whereby a microchip 100 having the sample collection section 1 and the analysis section 2 is formed as shown in FIG. 3.

The through-holes 11 to 14 of the chip part A penetrate through the chip part A in the thickness direction and correspond to a sample collection port 3, a sample reaching port 4, a sample retaining section 5 and an electrophoresis liquid retaining section 6, respectively, in the microchip 100.

In the chip parts A and B, when the microchip 100 is subjected to an analysis by electrophoresis, the detection window 15 is used for allowing light applied in the analysis to enter and exit therethrough, for example, in the measurement of absorbance. In the chip part B, the detection window 15 is arranged in such a manner to face at least a part of the second groove 18.

The first groove 16 of the chip part A, which corresponds to the region where the sample collection section 1 is formed, is a groove arranged between the through-hole 11 and the through-hole 12 on the surface shown in FIG. 1(b). In the immobilization step, a cationic polymer bonded with a hydrophilization substance is immobilized on the wall surface of the first groove 16, whereby hydrophilicity and a positively-charged layer are imparted. Further, in the below-described joining step, the chip part A and the chip part B are joined in such a manner that the first groove 16 of the chip part A and the region 17 of the chip part B face each other, whereby the sample collection section 1 is formed at a position where the first groove 16 and the region 17 face each other.

The first groove 16 is preferably a micro flow channel arranged between the through-hole 11 and the through-hole 12. The size of the first groove 16 is not particularly restricted, and the first groove 16 preferably has, for example, a depth of from 100 µm to 1,000 µm, a width of from 100 µm to 2,000 µm, and a length of from 1 mm to 20 mm.

The region 19 of the chip part A, which corresponds to the region where the analysis section 2 is, is a region arranged between the through-hole 13 and the through-hole 14 on the surface shown in FIG. 1(b). In the immobilization step, a cationic polymer bonded with a hydrophilization substance is immobilized in the region 19, whereby hydrophilicity and a positively-charged layer are imparted. Further, in the below-described joining step, the chip part A and the chip part B are joined in such a manner that the region 19 of the chip part A and the second groove 18 of the chip part B face each other, whereby the analysis section 2 is formed at a position where the region 19 and the second groove 18 face each other.

The second groove 18 of the chip part B, which corresponds to the region where the analysis section 2 is formed, is arranged in such a manner that, when the chip part A and the chip part B are joined, the sample retaining section 5 and the electrophoresis liquid retaining section 6, which correspond to the through-holes 13 and 14, respectively, are positioned at the each end of the second groove 18. In the immobilization step, a cationic polymer bonded with a hydrophilization substance is immobilized on the wall surface of the second groove 18, whereby hydrophilicity and a positively-charged layer are imparted.

When the chip part A and the chip part B are joined, the second groove 18 functions as an analysis section where a sample is analyzed, preferably a capillary tube in which a sample is analyzed by electrophoresis. The second groove 18 extends linearly along the longitudinal direction of the chip part B. The size of the second groove 18 is not particularly restricted, and the second groove 18 preferably has, for example, a depth of from 25 µm to 100 µm, a width of from 25 µm to 100 µm, and a length of from 5 mm to 150 mm.

The region 17 of the chip part B, which corresponds to the region where the sample collection section 1 is formed, is a region arranged on the surface shown in FIG. 2(b). In the immobilization step, a cationic polymer bonded with a hydrophilization substance is immobilized in the region 17, whereby hydrophilicity and a positively-charged layer are imparted. Further, in the below-described joining step, the chip part A and the chip part B are joined in such a manner that the first groove 16 of the chip part A and the region 17 of the chip part B face each other, whereby the sample collection section 1 is formed at a position where the first groove 16 and the region 17 face each other.

Examples of the material of the substrates (chip parts A and B) include glass, molten silica and resins, among which resins are preferred because of their cost, ease of processing and ease of immobilizing a cationic polymer thereon. Examples of the resins include acrylic resins (e.g., polymethyl methacrylate (PMMA)), polymethyl methacrylate, polycarbonate, polyvinylidene chloride, cyclic polyolefin, polyether ether ketone, polystyrene, polytetrafluoroethylene (PTFE), cycloolefin, polypropylene, and polyethylene, among which polymethyl methacrylate is preferred because of its excellent optical transparency.

SPECIFIC EXAMPLE 1 OF IMMOBILIZATION STEP

The immobilization step may include: a modification step of immobilizing a cationic polymer in the region where the sample collection section is formed and the region where the analysis section is formed; and a hydrophilization step of binding a hydrophilization substance to the immobilized cationic polymer. In this case, by first immobilizing the cationic polymer in the region where the sample collection section is formed and the region where the analysis section is formed and subsequently binding the hydrophilization substance to the immobilized cationic polymer, the cationic polymer bonded with the hydrophilization substance is immobilized in the above-described regions. Consequently, by a series of these steps, the region where the sample collection section is formed and the region where the analysis section is formed can be imparted with hydrophilicity and a positively-charged layer.

For example, a solution 1 containing a cationic polymer is prepared and applied to at least the region where the sample collection section is formed and the region where the analysis section is formed on a pair of substrates so as to immobilize the cationic polymer in these regions. After the cationic polymer is immobilized in these regions, if necessary, the pair of substrates may be washed with water or the like. Then, a hydrophilization substance may be bonded to the immobilized cationic polymer by preparing a solution 2 containing the hydrophilization substance and applying the solution 2 to at least the region where the sample collection section is formed and the region where the analysis section is formed on the pair of substrates, in which regions the cationic polymer has been immobilized.

For example, in the modification step, the cationic polymer is immobilized in the first groove 16 of the chip part A and the region 17 of the chip part B, which correspond to the region where the sample collection section 1 is formed. In the same manner, in the modification step, the cationic polymer is immobilized in the second groove 18 of the chip part B and the region 19 of the chip part A, which correspond to the region where the analysis section 2 is formed. Thereafter, in the hydrophilization step, a hydrophilization substance is bonded to the cationic polymer immobilized in the first groove 16 and the region 17 as well as to the cationic polymer immobilized in the second groove 18 and the region 19.

SPECIFIC EXAMPLE 2 OF IMMOBILIZATION STEP

Alternatively, in the immobilization step, a hydrophilization substance may be bonded to a cationic polymer and then the cationic polymer thus bonded with the hydrophilization substance may be immobilized in the region where the sample collection section is formed and the region where the analysis section is formed. In this case, for example, a solution 3 which contains the cationic polymer and the hydrophilization substance is prepared and the hydrophilization substance is allowed to bind to the cationic polymer in the solution 3, after which the solution 3 is applied to at least the region where the sample collection section is formed and the region where the analysis section is formed on the pair of substrates, whereby the cationic polymer bonded with the hydrophilization substance may be immobilized in these regions. Consequently, the region where the sample collection section is formed and the region where the analysis section is formed can be imparted with hydrophilicity and a positively-charged layer by the same step.

For example, after the hydrophilization substance is bonded to the cationic polymer, this cationic polymer is immobilized in the first groove 16 of the chip part A and the region 17 of the chip part B, which correspond to the region where the sample collection section 1 is formed, as well as in the second groove 18 of the chip part B and the region 19 of the chip part A, which correspond to the region where the analysis section 2 is formed.

In Specific Examples 1 and 2 of the immobilization step, examples of a method of applying the solutions 1 to 3 to the region where the sample collection section is formed and the region where the analysis section is formed include coating, immersion, dropwise addition, and spraying. Any method can be employed as long as the solutions 1 to 3 are applied to the region where the sample collection section is formed and the region where the analysis section is formed, and the solutions 1 to 3 may be applied to those parts of the substrates (chip parts A and B) other than the above-described regions.

As a step preceding to the immobilization step, from the standpoint of more preferably immobilizing a cationic polymer in the region where the sample collection section is formed and the region where the analysis section is formed, for example, a liquid-phase surface treatment (e.g., an alkaline solution treatment) or a gas-phase surface treatment (e.g., a vacuum ultraviolet treatment, a plasma treatment, a corona discharge treatment, a flaming treatment or an ozone treatment) may be performed.

(Cationic Polymer)

The cationic polymer used in the method of producing a microchip may be any polymer as long as it is immobilized on the resulting microchip and has a cationic group or a group ionizable into a cationic group. The cationic polymer may be a homopolymer of a cationic group-containing monomer, or a copolymer or polycondensate of a cationic group-containing monomer with other monomer(s). Examples of the cationic group or the group ionizable into a cationic group include nitrogen-containing groups, such as a primary amino group, a secondary amino group, a tertiary amino group, an imino group, an onium group and a hydrazide group, among which an onium group, particularly a quaternary onium group, is preferred because of its strong cationic property and from the standpoint of improving the analysis performance of the resulting microchip. Further, the cationic polymer is preferably soluble in water. From the standpoint of improving the analysis performance, the cationic polymer is preferably linear. Moreover, from the standpoint of improving the analysis performance, the total number of the cationic group and the group ionizable into a cationic group is preferably 2 or greater, and the cationic polymer preferably has two or more cationic groups.

Such a cationic polymer may be used singly, or in combination of two or more kinds thereof.

Examples of a cationic polymer having a primary to tertiary amino group include polyallylamine, polyvinyl amine, polylysine, polyarginine, polyhistidine, polyornithine, polydiallylamine, and polymethyldiallylamine.

Examples of a cationic polymer having an imino group include polyethyleneimine.

The onium group may be any cation as long as it coordinates and generates $H^+$ or a cation ($R^+$, wherein R is an alkyl group or the like) in a compound which contains an element having a lone electron pair, and examples of such a cation include an ammonium ion, a phosphonium ion, an oxonium ion, a sulfonium ion, a fluoronium ion, and chloronium ion. Thereamong, an ammonium ion and a phosphonium ion, which are quaternary onium groups, are preferred, and an ammonium ion is more preferred. Further, the cationic polymer is preferably a polycationic polymer having two or more onium groups (preferably quaternary onium groups, more preferably ammonium ions) in one molecule. The cationic polymer may be in the form of a salt, such as a chloride or a sulfide.

The cationic polymer preferably contains a polymer having an ammonium ion, more preferably at least a polyquaternium or a dimethylamine-epichlorohydrin copolymer, and it is still more preferred that the cationic polymer is at least a polyquaternium or a dimethylamine-epichlorohydrin copolymer.

The term "polyquaternium" used in the present disclosure refers to a cationic polymer which contains a structural unit derived from an ammonium ion-containing monomer. The polyquaternium can be confirmed in the INCI (International Nomenclature for Cosmetic Ingredients) directory. Examples of the polyquaternium include polydiallyldimethyl ammonium salts, such as polyquaternium-6 (poly (diallyldimethylammonium chloride), polyquaternium-7 (a copolymer of acrylamide and diallyldimethylammonium chloride), polyquaternium-4 (a diallyldimethylammonium chloride-hydroxyethyl cellulose copolymer) and polyquaternium-22 (a copolymer of acrylic acid and diallyldimethylammonium chloride); polyquaternium-1 (ethanol, 2,2',2"-nitrilotris-, polymer with 1,4-dichloro-2-butene and N,N,N', N'-tetramethyl-2-butene-1,4-diamine); polyquaternium-11 (a copolymer of vinylpyrrolidone and quaternized dimethylaminoethyl methacrylate); and polyquaternium-2 (poly [bis(2-chloroethyl)ether-alt-1,3-bis[3-(dimethylamino)propyl]urea]).

Examples of a hydrazide group-containing cationic polymer include aminopolyacrylamide.

From the standpoint of improving the analysis performance, the weight-average molecular weight of the cationic polymer is preferably not less than 10,000, more preferably not less than 50,000, still more preferably not less than 100,000. Further, from the standpoint of inhibiting an increase in the solution viscosity, the weight-average molecular weight of the cationic polymer is preferably 500,000 or less, more preferably 300,000 or less.

The hydrophilization substance used in the method of producing a microchip may be any substance as long as it is capable of binding to the above-described cationic polymer and imparting hydrophilicity to the region where the sample collection section is formed and the region where the analysis section is formed (preferably the region where the sample collection section is formed).

(Hydrophilization Substance)

The hydrophilization substance preferably has at least one anionic functional group since such a hydrophilization substance is capable of suitably binding to the cationic polymer. Examples of the anionic functional group include a carboxy group (a carboxylic acid group), a sulfo group (a sulfonic acid group), a sulfate group, a phosphate group, a phosphonic acid group, and a silanol group, among which a carboxy group and a sulfo group are preferred. The anionic functional group may be in the form of a salt as well.

The hydrophilization substance preferably has at least one (preferably one or two) hydrophilic functional group, more preferably at least one anionic functional group and at least one hydrophilic functional group, still more preferably one anionic functional group and at least one hydrophilic functional group, since such a hydrophilization substance is capable of suitably imparting hydrophilicity. Examples of the hydrophilic functional group include a hydroxyl group and an amino group and, for example, the hydrophilic functional group is preferably at least a hydroxyl group or an amino group.

The hydrophilization substance is preferably a compound which has at least a carboxy group or a sulfo group and at least a hydroxyl group or an amino group, more preferably a compound represented by the following Formula (1):

(1)

(wherein, P represents at least a carboxy group or a sulfo group; A represents at least a hydroxyl group or an amino group; R represents a linking group having a valence of (m+n); m represents an integer of from 1 to 3; n represents an integer of from 1 to 3; and plural Ps and plural As may each be the same or different).

In Formula (1), R is preferably a carbon-containing linking group, more preferably a linear or branched hydrocarbon group, still more preferably a divalent linking group such as an alkylene group (e.g., a methylene group, an ethylene group or a propylene group) or a phenylene group, particularly preferably an alkylene group.

In Formula (1), m is preferably 1, and n is preferably 1.

More specific examples of the hydrophilization substance include amino acids such as glycine and lysine, hydroxymethanesulfonic acid, hydroxyethanesulfonic acid, hydroxypropanesulfonic acid, hydroxybutanesulfonic acid, glycolic acid, lactic acid, tartronic acid, glyceric acid, hydroxybutyric acid, malic acid, tartaric acid, citramalic acid, citric acid, isocitric acid, leucic acid, mevalonic acid, pantoic acid, aminomethanesulfonic acid, aminoethanesulfonic acid (taurine), and aminopropanesulfonic acid. The hydrophilization substance may also be a salt, such as an alkali metal salt (e.g., a lithium salt or a sodium salt).

<Joining Step>

The method of producing a microchip according to the present embodiment includes, after the immobilization step, the joining step of joining the pair of substrates. By this joining step, a microchip in which the sample collection section and the analysis section are imparted with both hydrophilicity and a positively-charged layer is obtained.

In the joining step, the chip part A and the chip part B may be joined in such a manner that the first groove 16 of the chip part A and the region 17 of the chip part B face each other and the region 19 of the chip part A and the second groove 18 of the chip part B face each other. Consequently, the sample collection section 1 is formed at the position where the first groove 16 and the region 17 face each other, and the analysis section 2 is formed at the position where the region 19 and the second groove 18 face each other.

The method of joining the pair of substrates (e.g., chip parts A and B) is not particularly restricted, and examples thereof include a method of thermally compressing and joining the pair of substrates with their joining surfaces being in contact with each other.

[Microchip]

The microchip according to one embodiment of the invention includes: a sample collection section for collecting a sample; and an analysis section for analyzing the sample, wherein a cationic polymer bonded with a hydrophilization substance is immobilized on inner walls of the sample collection section and the analysis section. The microchip of this embodiment is a microchip whose sample collection section and analysis section are imparted with both hydrophilicity and a positively-charged layer and which can be produced by, for example, the above-described method of producing a microchip according to the present embodiment. Descriptions of the cationic polymer and the hydrophilization substance that are used for producing the microchip of the present embodiment are omitted herein since the cationic polymer and the hydrophilization substance are the same as those described above for the method of producing a microchip according to the present embodiment.

In the microchip of the present embodiment, from the standpoint of reducing the production cost, it is preferred that a single unit of the microchip contains both a sample collection section and an analysis section. Such a microchip may be obtained by joining a pair of substrates as in the above-described method of producing a microchip, and the sample collection section and the analysis section may be formed by joining the pair of substrates.

As one example, a microchip 100 shown in FIG. 3 will now be described. As shown in FIG. 3, the microchip 100 is obtained by joining a chip part A and a chip part B and includes: a sample collection section 1; an analysis section 2; a sample collection port 3; a sample reaching port 4; a sample retaining section 5; and an electrophoresis liquid retaining section 6. These constituents are described below.

The sample collection port 3 is a part through which a sample to be analyzed is fed (preferably by spotting) through an opening, and the sample collection port 3 is connected to one end of the sample collection section 1. The sample fed to the sample collection section 1 is collected in the sample collection section 1.

The sample collection section 1 is a flow channel which connects the sample collection port 3 and the sample reaching port 4 and is used for collecting the sample fed to the sample collection port 3, preferably a micro flow channel for collecting the sample fed to the sample collection port 3 using a capillary force. The sample fed to the sample collection port 3 is collected in the sample collection section 1 and sucked to the sample reaching port 4, preferably by a capillary force. In this process, since the sample collection section 1 is imparted with hydrophilicity, the sample collection section 1 has an excellent sample-collecting performance, so that the collected sample reaches the sample reaching port 4 through the sample collection section 1 in a short period.

The size of the sample collection section 1 is not particularly restricted, and the sample collection section 1 preferably has, for example, a depth of from 100 µm to 1,000 µm, a width of from 100 µm to 2,000 µm and a length of from 1 mm to 20 mm.

The sample reaching port 4 is a part which is connected to one end of the sample collection section 1 and used for retaining the sample reaching thereto through the sample collection section 1. At the sample reaching port 4, a diluted sample may be prepared by, for example, feeding a diluent via an opening and mixing the sample with the diluent. The main ingredient of the diluent is not particularly restricted, and examples thereof include water and physiological saline. Preferred examples of the diluent include a liquid that contains components similar to those of the below-described electrophoresis liquid. Further, the diluent may also be, for example, one obtained by adding an anionic polar group-containing compound to the main ingredient. Examples of the anionic polar group-containing compound include anionic polar group-containing polysaccharides, more specifically sulfated polysaccharides, carboxylated polysaccharides, sulfonated polysaccharide, and phosphorylated polysaccharide. As the carboxylated polysaccharides, alginic acid and salts thereof (e.g., sodium alginate) are preferred. As the sulfated polysaccharides, for example, chondroitin sulfate is preferred. There are 7 types of chondroitin sulfate, which are A, B, C, D, E, H and K, and any of these types of chondroitin sulfate may be used. The concentration of the anionic polar group-containing compound (chondroitin sulfate) is preferably in a range of, for example, from 0.01% by mass to 5% by mass.

The diluted sample obtained by mixing the sample with the diluent is fed to the sample retaining section 5.

The sample retaining section 5 is a reservoir for retaining the diluted sample fed from an opening and is connected to one end of the analysis section 2.

The analysis section 2 is a flow channel which connects the sample retaining section 5 and the electrophoresis liquid retaining section 6 and is used for analyzing the sample (diluted sample) fed to the sample retaining section 5. The analysis section 2 is preferably a capillary tube for analyzing the sample by electrophoresis.

The size of the analysis section 2 is not particularly restricted, and the analysis section 2 preferably has, for example, a depth of from 25 µm to 100 µm, a width of from 25 µm to 100 µm and a length of from 5 mm to 150 mm.

The electrophoresis liquid retaining section 6 is a reservoir which is connected to one end of the analysis section 2 and used for introducing an electrophoresis liquid fed via an opening to the analysis section 2. The electrophoresis liquid is a medium which is fed via the opening of the electrophoresis liquid retaining section 6, introduced to the analysis section 2 and thereby creates an electroosmotic flow during electrophoresis. The electrophoresis liquid is not particularly restricted, and it preferably contains an acid. Examples of the acid include citric acid, maleic acid, tartaric acid, succinic acid, fumaric acid, phthalic acid, malonic acid, and malic acid. In addition, it is preferred that the electrophoresis liquid contains a weak base. Examples of the weak base include arginine, lysine, histidine, and Tris. The pH of the electrophoresis liquid is preferably in a range of, for example, from 4.5 to 6. Examples of a buffer of the electrophoresis liquid include MES, ADA, ACES, BES, MOPS, TES, and HEPES. Further, in the electrophoresis liquid as well, the anionic polar group-containing compound described above for the diluent may be added. The concentration of the anionic polar group-containing compound (e.g., chondroitin sulfate) is preferably in a range of, for example, from 0.01% by mass to 5% by mass.

In the microchip 100, a diluted sample is fed to the sample retaining section 5, and the electrophoresis liquid is then fed to the electrophoresis liquid retaining section 6 and introduced to the analysis section 2 with a pressure, after which a voltage is applied by bringing an anode and a cathode into contact with the sample retaining section 5 and the electrophoresis liquid retaining section 6, respectively. Consequently, an electroosmotic flow is created in the analysis section 2, the dilute sample is introduced from the sample retaining section 5 to the analysis section 2 and, when the diluted sample moves from the sample retaining section 5 toward the electrophoresis liquid retaining section 6, the components contained in the diluted sample are separated. The voltage to be applied is, for example, preferably from 0.5 kV to 10 kV, more preferably from 0.5 kV to 5 kV.

In the microchip 100, the analysis section 2 is imparted with a positively-charged layer and thus has excellent analysis performance.

The components (substance to be analyzed) separated in the analysis section 2 can be measured by an optical method, such as absorbance measurement. For example, the absorbance may be measured by irradiating a light through the detection window 15 on the chip part A side. When hemoglobin is the substance to be analyzed that is contained in the diluted sample, for example, it is preferred to measure the absorbance at a wavelength of 415 nm. Further, the ratio and the like of the components contained in the diluted sample may be determined by calculating the height, area and the like of peaks in an electropherogram obtained by the absorbance measurement.

The position at which the components separated in the analysis section 2 are measured, that is, the position at which the detection window 15 is arranged, may be determined as appropriate in accordance with the length and the like of the analysis section 2.

[Kit]

The microchip of the present embodiment may be provided as a kit in combination with a cartridge in which the solutions for analysis are stored. The kit may include, for example: the microchip of the present embodiment; and cartridges in which the diluent and the electrophoresis liquid are each stored.

[Analysis System]

The microchip of the present embodiment may also be provided as an analysis system in combination with an analyzer on which the microchip is mounted. The analysis system includes, for example: the above-described microchip 100; and an analyzer which includes electrodes, a light-emitting section, a measurement section, a diluent reservoir, an electrophoresis liquid reservoir, a pump, and a control unit.

The electrodes apply a prescribed voltage to the analysis section 2, and examples of the electrodes include an anode inserted into the sample retaining section 5 and a cathode inserted into the electrophoresis liquid retaining section 6.

The light-emitting section is, for example, a part which emits a light for the absorbance measurement and irradiates the light to the detection window 15. The light-emitting section includes, for example, an LED chip which emits a light of a prescribed wavelength range, an optical filter, and a lens. The light-emitting section may further include a slit.

The measurement section is, for example, a part which receives the light irradiated to the detection window 15 and measures the absorbance. The measurement section includes, for example, a photodiode and a photo IC.

The diluent reservoir is, for example, a reservoir which retains the diluent fed to the sample reaching port 4, and the electrophoresis liquid reservoir is, for example, a reservoir which retains the electrophoresis liquid fed to the electrophoresis liquid retaining section 6.

The pump is, for example, a part used for feeding the diluent to the sample reaching port 4 by pressure application, feeding the electrophoresis liquid to the electrophoresis liquid retaining section 6 by pressure application, and introducing the electrophoresis liquid to the analysis section 2. The pump may also be used for feeding the diluted sample contained in the sample reaching port 4 to the sample retaining section 5.

The control unit controls the above-described constituents of the analyzer and includes, for example, a CPU, a memory, and an interface.

EXAMPLES

One embodiment of the invention will now be described based on the following Examples; however, the invention is not restricted thereto by any means.

Example 1

<1: Preparation of Chip Parts>

Using PMMA (polymethyl methacrylate) as a material for the preparation of chip parts, a chip part A shown in FIG. 1 and a chip part B shown in FIG. 2 were prepared by molding the material. The thicknesses of the chip parts A and B and the sizes of the constituents were as follows. By joining the chip part A and the chip part B in the subsequent step, a microchip 100 including: a sample collection section 1 constituted by a first groove 16 and a region 17 on the surface of the chip part B; and an analysis section 2 constituted by a second groove 18 and a region 19 on the back side (joining surface) of the chip part A was formed.

(Chip Part A)

Thickness: 1.5 mm

First groove 16 (sample collection section 1): depth 0.5 mm×width 1 mm×length 6 mm Through-hole 11 (sample collection port 3): φ1.0 mm Through-hole 12 (sample reaching port 4): φ1.0 mm Through-hole 13 (sample retaining section 5): capacity=10 μL Through-hole 14 (electrophoresis liquid retaining section 6): capacity=10 μL (Chip Part B)

Thickness: 1.5 mm

Second groove 18: depth 0.04 mm×width 0.04 mm×length 30 mm

<2: Preparation of Aqueous Solution A>

An aqueous solution A was prepared by mixing the following components. In the aqueous solution A, sodium hydroxymethanesulfonate, which is a hydrophilization substance, was bonded to polydiallyldimethyl ammonium chloride, which is a cationic polymer. The hydrophilization substance (sodium hydroxymethanesulfonate) used in this Example contains one sulfo group as an anionic functional group and one hydroxyl group as a hydrophilic functional group.

(Aqueous Solution A)
polydiallyldimethyl ammonium chloride (PDADMAC; polyquaternium-6, weight-average molecular weight=from 100,000 to 500,000, trade name: FPA1000L, manufactured by SENKA Corporation): 1% w/v
sodium hydroxide (NaOH, manufactured by Kishida Chemical Co., Ltd.): 10 mM
sodium hydroxymethanesulfonate 0.5-hydrate (HMS-Na, manufactured by Tokyo Chemical Industry Co., Ltd.): 100 mM <3: Immobilization Step>

Using a VUV irradiation apparatus (model: MECL-I-3-500, manufactured by M.D.COM Inc.), the joining surfaces of the chip parts A and B were irradiated with vacuum ultraviolet light (VUV) at a cumulative illuminance of 420 mJ/cm$^2$. Subsequently, the chip parts A and B were immersed in the above-described aqueous solution A at room temperature (23±2° C.) for 24 hours. Thereafter, the chip parts A and B were thoroughly washed with water, and water adhering to the chip parts A and B were removed by spraying compressed air. As a result of a series of the steps performed up to this point, the cationic polymer bonded with hydroxymethanesulfonic acid as a hydrophilization substance was immobilized on the joining surfaces of the chip parts A and B.

<4: Joining Step>

With the joining surface of the chip part A and that of the chip part B being in contact with each other, the chip parts A and B were joined together by thermal compression joining (at a temperature of 80° C. and a pressure of 16 kgf/cm$^2$ (1.57 MPa) for 1 minute). By this process, the microchip 100 as shown in FIG. 3, in which the sample collection section 1 and the analysis section 2 that were immobilized with the cationic polymer bonded with the hydrophilization substance were arranged in the same unit, was produced.

<5: Evaluation of Hydrophilicity>

In accordance with the following procedures, the hydrophilicity of the sample collection section of the microchip was evaluated at two time points—immediately after the production and after one-week storage at 50° C. along with a desiccant in a hermetically sealed condition. As a sample, human whole blood was used.

1) A prescribed amount (3 μL) of the sample was spotted to the sample collection port of the sample collection section. The spotted sample was sucked toward the sample reaching port by a capillary force.

2) Taking the time point at which the sample was spotted as 0 second, the time required for the sample to reach the sample reaching port (time required for sample collection) was measured.

[Evaluation Criteria]

At the time points of immediately after the production and after the one-week storage at 50° C., the criteria for the evaluation of hydrophilicity were as follows. Evaluations of "A" and "B" mean that the sample collection section had favorable hydrophilicity.

A: There was no difference in the time required for the sample to reach the sample reaching port between the time points of immediately after the production and after the one-week storage at 50° C.

B: There was a difference in the time required for the sample to reach the sample reaching port between the time points of immediately after the production and after the one-week storage at 50° C.; however, the sample reached the sample reaching port in both microchips of immediately after the production and after the one-week storage at 50° C.

C: The sample did not reach the sample reaching port at least in one of the microchips of immediately after the production and after the one-week storage at 50° C.

The results are shown in Tables 1 and 2 below.

<6: Functional Evaluation of Positively-Charged Layer>

In accordance with the following procedures, hemoglobin in human whole blood was analyzed to evaluate the function of the positively-charged layer of the analysis section of the microchip. For the analysis, a special apparatus manufactured by ARKRAY, Inc. for electrophoresis was used along with the microchip.

1) The microchip was set on the special apparatus manufactured by ARKRAY, Inc. 2) The below-described electrophoresis liquid (2) was added to the electrophoresis liquid retaining reservoir (electrophoresis liquid retaining section) of the microchip, and the electrophoresis liquid (2) was introduced to the analysis section with a pressure.

3) The human whole blood was 41-fold diluted with the below-described electrophoresis liquid (1), and the thus diluted sample was added to the sample retaining reservoir (sample retaining section).

4) An anode and a cathode were brought into contact with the sample retaining reservoir and the electrophoresis liquid retaining reservoir, respectively, and electrophoresis was initiated under constant current control at 72 μA.

5) The absorbance at 415 nm was measured in the measurement section to obtain an electropherogram. The electrophoresis was performed for 60 seconds.

[Electrophoresis Liquid (1)]

citric acid: 38 mM, sodium chondroitin sulfate C: 0.95% w/v, 1-(3-sulfopropyl)pyridinium hydroxide inner salt: 475 mM, 2-morpholinoethanesulfonic acid: 19 mM, EMULGEN LS-110: 0.1% w/v, sodium azide: 0.02% w/v, PROCLIN 300: 0.025% w/v, dimethylaminoethanol (for pH adjustment), pH=6.0

[Electrophoresis Liquid (2)]

citric acid: 40 mM, sodium chondroitin sulfate C: 1.25% w/v, piperazine: 20 mM, EMULGEN LS-110: 0.1% w/v, sodium azide: 0.02% w/v, PROCLIN 300: 0.025% w/v, dimethylaminoethanol (for pH adjustment), pH=5.0

[Evaluation Criteria]

The criteria for the evaluation of the function of the positively-charged layer were as follows.

A: In the thus obtained electropherogram, separation of L-HbA1c (L-A1C), S-HbA1c (s-A1C) and HbA0 was confirmed.

B: In the thus obtained electropherogram, separation of L-HbA1c, S-HbA1c and HbA0 was not confirmed.

The results are shown in FIGS. 4 (a) to (j) and Table 2 below.

Example 2

A microchip was produced in the same manner as in Example 1, except that the following aqueous solution B was prepared in place of the aqueous solution A in <2: Preparation of Aqueous Solution A>. For the thus produced microchip, <5: Evaluation of Hydrophilicity> and <6: Functional Evaluation of Positively-Charged Layer> were performed in the same manner as in Example 1. It is noted here that the hydrophilization substance (taurine) used in this Example contains one sulfo group as an anionic functional group and one amino group as a hydrophilic functional group.

(Aqueous Solution B)
polydiallyldimethyl ammonium chloride (PDADMAC; polyquaternium-6, weight-average molecular weight=from 100,000 to 500,000, trade name: FPA1000L, manufactured by SENKA Corporation): 1% w/v sodium hydroxide (NaOH, manufactured by Kishida Chemical Co., Ltd.): 10 mM taurine (manufactured by Nacalai Tesque, Inc.): 100 mM Example 3

A microchip was produced in the same manner as in Example 1, except that the following aqueous solution C was prepared in place of the aqueous solution A in <2: Preparation of Aqueous Solution A>. For the thus produced microchip, <5: Evaluation of Hydrophilicity> and <6: Functional Evaluation of Positively-Charged Layer> were performed in the same manner as in Example 1. It is noted here that the hydrophilization substance (lithium lactate) used in this Example contains one carboxy group as an anionic functional group and one hydroxyl group as a hydrophilic functional group.

(Aqueous Solution C)

polydiallyldimethyl ammonium chloride (PDADMAC; polyquaternium-6, weight-average molecular weight=from 100,000 to 500,000, trade name: FPA1000L, manufactured by SENKA Corporation): 1% w/v sodium hydroxide (NaOH, manufactured by Kishida Chemical Co., Ltd.): 10 mM lithium lactate (manufactured by Nacalai Tesque, Inc.): 100 mM Example 4

A microchip was produced in the same manner as in Example 1, except that the following aqueous solution D was prepared in place of the aqueous solution A in <2: Preparation of Aqueous Solution A>. For the thus produced microchip, <5: Evaluation of Hydrophilicity> and <6: Functional Evaluation of Positively-Charged Layer> were performed in the same manner as in Example 1. It is noted here that the hydrophilization substance (glycine) used in this Example contains one carboxy group as an anionic functional group and one amino group as a hydrophilic functional group.

(Aqueous Solution D)

polydiallyldimethyl ammonium chloride (PDADMAC; polyquaternium-6, weight-average molecular weight=from 100,000 to 500,000, trade name: FPA1000L, manufactured by SENKA Corporation): 1% w/v sodium hydroxide (NaOH, manufactured by Kishida Chemical Co., Ltd.): 10 mM glycine (manufactured by Nacalai Tesque, Inc.): 100 mM Example 5

A microchip was produced in the same manner as in Example 1, except that the following aqueous solution E was prepared in place of the aqueous solution A in <2: Preparation of Aqueous Solution A>. For the thus produced microchip, <5: Evaluation of Hydrophilicity> and <6: Functional Evaluation of Positively-Charged Layer> were performed in the same manner as in Example 1. It is noted here that the hydrophilization substance (lysine) used in this Example contains one carboxy group as an anionic functional group and two amino groups as hydrophilic functional groups.

(Aqueous Solution E)

polydiallyldimethyl ammonium chloride (PDADMAC; polyquaternium-6, weight-average molecular weight=from 100,000 to 500,000, trade name: FPA1000L, manufactured by SENKA Corporation): 1% w/v sodium hydroxide (NaOH, manufactured by Kishida Chemical Co., Ltd.): 10 mM lysine (manufactured by Nacalai Tesque, Inc.): 100 mM Example 6

A microchip was produced in the same manner as in Example 1, except that the following aqueous solutions F and G were prepared in place of the aqueous solution A in <2: Preparation of Aqueous Solution A> and the below-described operations were performed in <3: Immobilization Step>. For the thus produced microchip, <5: Evaluation of Hydrophilicity> and <6: Functional Evaluation of Positively-Charged Layer> were performed in the same manner as in Example 1.

(Aqueous Solution F)

polydiallyldimethyl ammonium chloride (PDADMAC; polyquaternium-6, weight-average molecular weight=from 100,000 to 500,000, trade name: FPA1000L, manufactured by SENKA Corporation): 1% w/v sodium hydroxide (NaOH, manufactured by Kishida Chemical Co., Ltd.): 10 mM (Aqueous Solution G)

sodium hydroxymethanesulfonate 0.5-hydrate (HMS-Na, manufactured by Tokyo Chemical Industry Co., Ltd.): 100 mM <3: Immobilization Step (Modification Step)>

Using a VUV irradiation apparatus (model: MECL-I-3-500, manufactured by M.D.COM Inc.), the joining surfaces of the chip parts A and B were irradiated with vacuum ultraviolet light (VUV) at a cumulative illuminance of 420 mJ/cm$^2$. Subsequently, the chip parts A and B were immersed in the above-described aqueous solution F at room temperature (23±2° C.) for 24 hours. Thereafter, the chip parts A and B were thoroughly washed with water, and water adhering to the chip parts A and B were removed by spraying compressed air. By this step, the cationic polymer was immobilized on the joining surfaces of the chip parts A and B.

<3: Immobilization Step (Hydrophilization Step)>

The chip parts A and B were immersed in the above-described aqueous solution G at room temperature (23±2° C.) for 10 minutes. Then, the chip parts A and B were thoroughly washed with water, and water adhering to the chip parts A and B were removed by spraying compressed air. By this step, a hydrophilization substance was bonded to the cationic polymer immobilized on the joining surfaces of the chip parts A and B, whereby the hydrophilization step was completed. It is noted here that, in this Example, sodium hydroxymethanesulfonate was used as the hydrophilization substance in the same manner as in Example 1.

Example 7

A microchip was produced in the same manner as in Example 6, except that the following aqueous solution J was prepared in place of the aqueous solution G and this aqueous solution J was used in place of the aqueous solution G in <3: Immobilization Step (Hydrophilization Step)>. For the thus produced microchip, <5: Evaluation of Hydrophilicity> and <6: Functional Evaluation of Positively-Charged Layer> were performed in the same manner as in Example 6. It is noted here that, in this Example, trisodium citrate containing three carboxy groups as anionic functional groups and one hydroxyl group as a hydrophilic functional group was used as the hydrophilization substance.

(Aqueous Solution J)

trisodium citrate (manufactured by Wako Pure Chemical Industries, Ltd.): 100 mM

Comparative Example 1

A microchip was produced in the same manner as in Example 6, except that <3: Immobilization Step (Hydrophilization Step)> was not performed. For the thus produced microchip, <5: Evaluation of Hydrophilicity> and <6: Functional Evaluation of Positively-Charged Layer> were performed in the same manner as in Example 6.

Comparative Example 2

A microchip was produced in the same manner as in Example 6, except that the following aqueous solution H was prepared in place of the aqueous solutions <3: Immobilization Step (Modification Step)> was performed and the aqueous solution H was used in place of the aqueous solution G in <3: Immobilization Step (Hydrophilization Step)>. For the thus produced microchip, <5: Evaluation of Hydrophilicity> and <6: Functional Evaluation of Positively-Charged Layer> were performed in the same manner as in Example 6. It is noted here that, in this Comparative Example, silica which is a fine-powder inorganic compound (a hydrophilic substance that cannot bind with a cationic polymer) was used as the hydrophilization substance.

(Aqueous Solution H)

silica-containing aqueous solution (main component: silicon dioxide, trade name: SELFACE COAT, manufactured by Marusyo Sangyo Co., Ltd.)

Comparative Example 3

A microchip was produced in the same manner as in Example 6, except that the following aqueous solution I was prepared in place of the aqueous solutions <3: Immobilization Step (Modification Step)> was performed and the aqueous solution I was used in place of the aqueous solution G in <3: Immobilization Step (Hydrophilization Step)>. For the thus produced microchip, <5: Evaluation of Hydrophilicity> and <6: Functional Evaluation of Positively-Charged Layer> were performed in the same manner as in Example 6. It is noted here that, in this Comparative Example, a polyoxyalkylene alkyl ether containing a polyoxyalkylene chain as a hydrophilic functional group but not an anionic functional group (a hydrophilic substance that cannot bind with a cationic polymer) was used as the hydrophilization substance.

(Aqueous Solution I)

polyoxyalkylene alkyl ether (trade name: EMULGEN LS-110, manufactured by Kao Corporation): 0.1% w/v For Examples 2 to 7 and Comparative Examples 1 to 3, the results of <5: Evaluation of Hydrophilicity> and <6: Functional Evaluation of Positively-Charged Layer> are shown in Tables 1 and 2 below.

TABLE 1

| | Time required for sample collection (seconds) | | |
|---|---|---|---|
| | Immediately after production | After one-week storage at 50° C. | Evaluation |
| Example 1 | 1 | 1 | A |
| Example 2 | 1 | 1 | A |
| Example 3 | 1 | 1 | A |
| Example 4 | 1 | 1 | A |
| Example 5 | 1 | 1 | A |
| Example 6 | 1 | 1 | A |
| Example 7 | 1 | 13 | B |
| Comparative Example 1 | — | — | C |
| Comparative Example 2 | 1 | 1 | A |
| Comparative Example 3 | 1 | — | C |

—: sample could not be collected

TABLE 2

| | Hydrophilicity | Function of positively-charged layer | Satisfaction of both functions |
|---|---|---|---|
| Example 1 | A | A | possible |
| Example 2 | A | A | possible |
| Example 3 | A | A | possible |
| Example 4 | A | A | possible |
| Example 5 | A | A | possible |
| Example 6 | A | A | possible |
| Example 7 | B | A | possible |
| Comparative Example 1 | C | A | not possible |
| Comparative Example 2 | A | B | not possible |
| Comparative Example 3 | C | B | not possible |

As shown in Tables 1 and 2, in Examples 1 to 7 (particularly in Examples 1 to 6), the microchips had favorable hydrophilicity both immediately after the production and after the one-week storage at 50° C. On the other hand, in Comparative Examples 1 and 2, the microchips had poor hydrophilicity at least immediately after the production or after the one-week storage at 50° C.

Further, as shown in FIGS. 4 (a) to (j), in Examples 1 to 7, separation of L-HbA1c, S-HbA1c and HbA0 was confirmed, and favorable evaluations were thus obtained for the functional evaluation of the positively-charged layer. On the other hand, in Comparative Examples 2 and 3, separation of L-HbA1c, S-HbA1c and HbA0 was not confirmed, and the results of the functional evaluation of the positively-charged layer were thus poor.

From the above, the functions of the hydrophilicity and the positively-charged layer were both satisfied in Examples 1 to 7; however, in Comparative Examples 1 to 3, at least the hydrophilicity or the function of positively-charged layer was poor, and the two functions of hydrophilicity and positively-charged layer could not be satisfied at the same time.

DESCRIPTION OF SYMBOLS

1: Sample collection section
2: Analysis section
3: Sample collection port
4: Sample reaching port
5: Sample retaining section
6: Electrophoresis liquid retaining section 11, 12, 13, 14: Through-hole
15: Detection window
16: First groove (region where the sample collection section is formed)
17: Region (region where the sample collection section is formed)
18: Second groove (region where the analysis section is formed)
19: Region (region where the analysis section is formed)
A, B: Chip part
100: Microchip

What is claimed is:

1. A microchip comprising:
a flow channel,
wherein a cationic polymer bonded with a hydrophilization substance having one or more anionic functional groups is immobilized on inner walls of the flow channel.

2. The microchip according to claim 1, wherein the anionic functional groups include at least a carboxy group or a sulfo group.

3. The microchip according to claim 1, wherein the hydrophilization substance has one or more hydrophilic functional groups.

4. The microchip according to claim 3, wherein the hydrophilic functional groups include at least a hydroxyl group or an amino group.

5. The microchip according to claim 1, wherein the cationic polymer comprises at least a polyquaternium or a dimethylamine-epichlorohydrin copolymer.

6. An analysis system comprising:
the microchip according to claim 1; and
an analyzer on which the microchip is mounted.

7. The microchip according to claim 1, wherein the flow channel comprises a sample collection section for collecting a sample and an analysis section for analyzing the sample.

8. The microchip according to claim 7, wherein a single unit of the microchip comprises both the sample collection section and the analysis section.

9. The microchip according to claim 7, wherein the sample collection section and the analysis section are formed by joining a pair of substrates.

10. The microchip according to claim 7, wherein the sample collection section collects the sample using a capillary force.

11. The microchip according to claim 7, wherein the analysis section is a capillary tube.

12. A method of producing a microchip, the method comprising:
an immobilization step of immobilizing, on a pair of substrates, a cationic polymer bonded with a hydrophilization substance in a region where a sample collection section for collecting a sample using a capillary force is formed and a region where an analysis section for analyzing the sample is formed; and
after the immobilization step, a joining step of joining the pair of substrates,
wherein, by the joining step, the sample collection section and the analysis section, in which the cationic polymer bonded with the hydrophilization substance is immobilized, are formed.

13. The method of producing a microchip according to claim 12, wherein the immobilization step comprises:
a modification step of immobilizing the cationic polymer in the region where the sample collection section is formed and the region where the analysis section is formed; and
a hydrophilization step of bonding the hydrophilization substance to the immobilized cationic polymer.

14. The method of producing a microchip according to claim 12, wherein, in the immobilization step, after the hydrophilization substance is bonded to the cationic polymer, the cationic polymer bonded with the hydrophilization substance is immobilized in the region where the sample collection section is formed and the region where the analysis section is formed.

15. A microchip comprising:
a sample collection section for collecting a sample; and
an analysis section for analyzing the sample,
wherein a cationic polymer bonded with a hydrophilization substance is immobilized on inner walls of the sample collection section and the analysis section, and the sample collection section collects the sample using a capillary force.

16. The microchip according to claim 15, wherein the hydrophilization substance has one or more anionic functional groups.

* * * * *